United States Patent [19]

Nozaki et al.

[11] Patent Number: 4,602,356
[45] Date of Patent: Jul. 22, 1986

[54] SEMICONDUCTOR MEMORY DEVICE

[75] Inventors: Shigeki Nozaki, Kawasaki; Yoshihiro Takemae; Seiji Enomoto, both of Yokohama, all of Japan

[73] Assignee: Fujitsu Limited, Kawasaki, Japan

[21] Appl. No.: 445,921

[22] Filed: Dec. 1, 1982

[30] Foreign Application Priority Data

Dec. 2, 1981 [JP] Japan .................. 56-194200

[51] Int. Cl.[4] .................................. G11C 8/00
[52] U.S. Cl. .................... 365/230; 365/189
[58] Field of Search ............... 365/189, 230, 233, 193

[56] References Cited

U.S. PATENT DOCUMENTS 3,969,706 7/1976 Proebsting et al. ................ 365/230
4,376,989 3/1983 Takemae ............................ 365/230
4,397,001 8/1983 Takemae ............................ 365/189

OTHER PUBLICATIONS

Patent Abstracts of Japan, vol. 3, No. 28, (E-96), Mar. 9, 1979, p. 31 E 96 & JP-A-54 6429, (Tokyo Shibaura Denki K.K.) 01-18-1979.
Patent Abstracts of Japan, vol. 3, No. 36, (E-100), Mar. 27, 1979, p. 62 E 100 & JP-A-54 14131 (Fujitsu K.K.) 02-02-1979.
IEEE International Solid-State Circuits Conference, Feb. 15, 1980, pp. 230-231, IEEE, New York, L. S. White et al., "Session XVII: Random Access Memories", p. 230, left-hand col., line 44-right-hand col., line 11, Figs. 3, 4.
European Search Report of 06-28-83 by Examiner Degraeve at The Hague.

Primary Examiner—Joseph A. Popek
Attorney, Agent, or Firm—Staas & Halsey

[57] ABSTRACT

A semiconductor memory device operates under a so-called address multiplex access method. A row part of the device is enabled by receiving a row address strobe ($\overline{RAS}$) signal. A column part of the device is enabled by simultaneously receiving both a column address strobe ($\overline{CAS}$) signal and a timing control signal supplied from the row part during its enable state. A column address buffer in the column part is enabled by simultaneously receiving both the $\overline{CAS}$ signal and a timing control signal. The timing control signal is produced from a circuit when it detects and holds the $\overline{RAS}$ signal.

6 Claims, 16 Drawing Figures

SEMICONDUCTOR MEMORY DEVICE

BACKGROUND OF THE INVENTION (1) Field of the Invention

The present invention relates to a semiconductor memory device, more particularly to a circuit for controlling a column part of the semiconductor memory device.

(2) Description of the Prior Art

In a typical semiconductor memory device, a write operation or a read operation is accomplished by first selecting the desired row line, that is, word line, and then selecting the desired column line, that is, bit line. This allows the selection of the memory cell located at the cross point of the selected row and column lines and a write or read operation occurs.

As is obvious from the above, write or read operations are achieved for the column and row lines not simultaneously, but sequential. In light of this sequentially operation, an address multiplex access method has been proposed, for example in U.S. Pat. No. 3,969,706, July 13, 1976, in the name of Robert James Proebsting et al, entitled "Dynamic Random Access Memory MISFET Integrated Circuit". According to the address multiplex access method, first a row address strobe signal is externally supplied to the memory to establish a row access mode. Next, a column address strobe signal is externally supplied to establish a column access mode. The column access mode starts when the column address strobe signal and a column address enable signal are both given. The column address enable signal is usually generated after processing is completed. The processing is started by receiving the row address strobe signal.

In this regard, the recent trend in semiconductor memory devices is toward very high speed read and write operations. That is, the write or read access time must be as short as possible. In the prior art, there is a disadvantage in that the above-mentioned memory access operation cannot be conducted at a very high speed. This is because it takes a relatively long time to produce the aforementioned column address enable signal.

SUMMARY OF THE INVENTION

It is an object of the present invention to realize a very high speed read and write operation in a semiconductor memory device compared with that of the prior art semiconductor memory device.

The above object is attained by a semiconductor memory device provided with a circuit for detecting and holding the row address strobe signal so as to produce a timing control signal to be supplied to a column address buffer.

The present invention will be more apparent from the ensuing description with reference to the accompanying drawings.

DESCRIPTION OF THE PREFERRED EMBODIMENTS

Figure 1:
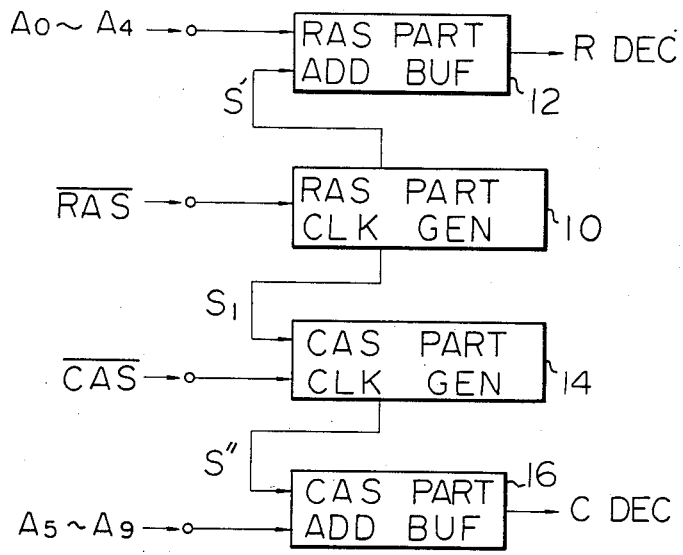
FIG. 1 is a block circuit diagram for memory cell selection in a prior art semiconductor memory device.

FIG. 1 is a block diagram of circuits used for memory cell selection in a prior art semiconductor memory device. As will be apparent hereinafter, the memory device of the present invention is based on the circuit arrangement shown in FIG. 1. In this figure, reference symbol $\overline{RAS}$ indicates the aforementioned row address strobe signal. The signal $\overline{RAS}$ is received by a RAS part clock generator (RAS PART CLK GEN) 10 which produces clocks used for carrying out various controls in the RAS part, such as an address fetch, a precharge of a row decoder, and a row line selection. Reference numeral 12 represents a RAS part address buffer i.e., row address buffer, (RAS PART ADD BUF), which is triggered by a signal S' and supplies the external row address $A_0$ to $A_4$ thereto. Thereafter, the buffer 12 supplies an address, which is an inverted row address of $A_0$ to $A_4$, to the row decoder (RDEC) (not shown in FIG. 1). Reference symbol $\overline{CAS}$ indicates the aforesaid column address strobe signal. The signal CAS is received by a CAS part clock generator (CAS PART CLK GEN) 14 which produces clocks used for carrying out various controls in the CAS part, such as those mentioned above regarding the RAS part. Reference numeral 14 represents a CAS part address buffer (CAS PART ADD BUF), i,e., column address buffer, which is triggered by a timing control signal S" and supplies the external column address $A_5$ to $A_9$ thereto. Thereafter, the buffer 14 supplies a column address to a column decoder (CDEC) (not shown in FIG. 1). It should be noted that the row address $A_0$ to $A_4$ and the column address $A_5$ to $A_9$ are applied alternatively to the same address input pins of the memory device.

Figure 2:
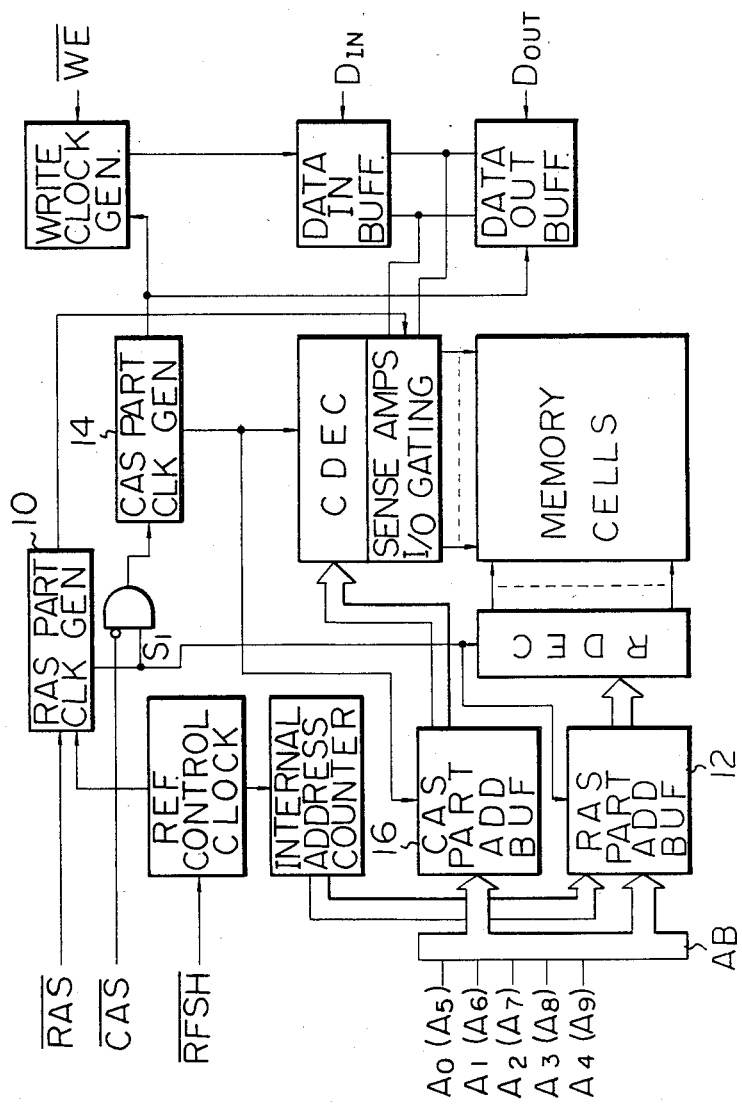
FIG. 2 is a block diagram of a prior art semiconductor memory device employing the arrangement shown in FIG. 1.

FIG. 2 is a block diagram of one example of a prior art semiconductor memory device employing the arrangement shown in FIG. 1. In FIG. 2, members the same as in FIG. 1 are represented by the same reference numerals or symbols.

The block diagram of FIG. 2 may assist the understanding of the location of each member shown in FIG. 1 inside the semiconductor memory device.

Figure 3:
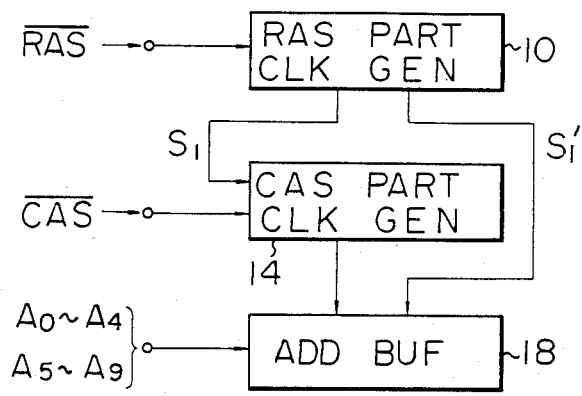
FIG. 3 is a block circuit diagram for achieving another type of memory cell selection in a prior art semiconductor memory device.

FIG. 3 is a block diagram of circuits, as in FIG. 1, for achieving another type of memory cell selection in a prior art semiconductor memory device. It is known that the arrangement of FIG. 3 is employed in a currently used Mostek type semiconductor memory device by Mostek Corporation of the U.S. In the arrangement of FIG. 3, the RAS part address buffer 12 and the CAS part address buffer 14, both shown in FIGS. 1 and 2, are commonly realized by a single address buffer (ADD BUF) 18. Since the row and column address buffers are realized by one buffer 18, the arrangement of FIG. 3 is advantageous from the viewpoint of pattern density in an integrated circuit (IC). However, the semiconductor memory device of the present invention is not based on such a common buffer type arrangement as in FIG. 3. In FIG. 3 and also FIGS. 1 and 2, actually, inverted $\overline{RAS}$ and $\overline{CAS}$ signals are used. Therefore symbols $\overline{RAS}$ and $\overline{CAS}$ are used for the externally supplied row and column strobe signals, respectively.

Figure 4:
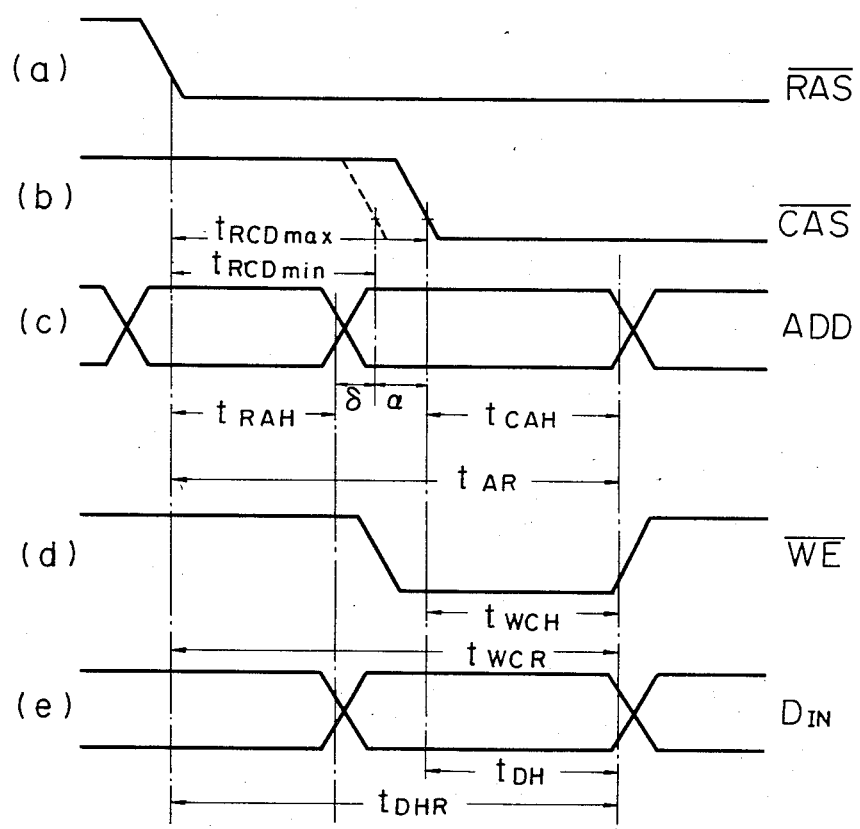
FIG. 4 is a timing diagram for explaining the operations performed in FIGS. 1 and 2.

FIG. 4 is a timing diagram used for explaining the operations performed in FIGS. 1 and 2. As seen from FIG. 4, the $\overline{RAS}$ signal is supplied first (see row (a)). When the level of the $\overline{RAS}$ signal changes from H (high) to L (low), the row address fetch operation becomes enabled. Reference symbol $t_{RAH}$ (see row (c)) represents a term in which the row address is held. Therefore, the term $t_{RAH}$ may be called a row address hold (RAH) term. Next, that is, after a term $t_{RCD}$, the level of the $\overline{CAS}$ signal is changed to L (see row (b)), and thereby the column address fetch operation becomes enabled. The term $t_{RCD}$ denotes a time delay from the row access to the column access. Reference symbol $t_{CAH}$ (see row (c)) represents a term in which the column address fetch operation is carried out. Therefore, the term $t_{CAH}$ may be called a column address hold (CAH) term.

Reference symbol $\overline{WE}$ denotes a write enable signal. Actually, an inverted signal of WE, that is, $\overline{WE}$, is used as shown at the top right in FIG. 2. When the level of $\overline{WE}$ is high, the read operation cycle is maintained. If the level of $\overline{WE}$ is changed from H to L (see row (d)), this means that a write operation cycle is specified. The specifying of the write operation cycle commences after completion of the row address fetch operation and also immediately after the level change of $\overline{CAS}$ from H to L. The write operation cycle is completed after a write command hold (WCH) term $t_{WCH}$ has elapsed (see row (d)). Specifically, the write operation is completed after the minimum term of $t_{WCR}$ (see row (e)), that is, $t_{WCRmin}$, and the minimum term of $t_{WCH}$, that is, $t_{WCHmin}$, both elapse. The term $t_{WCRmin}$ denotes the term from when the level of $\overline{RAS}$ changes to L to when the specifying of the write operation cycle is released. The term $t_{WCHmin}$ denotes the term from when the level of $\overline{CAS}$ changes to L to when the specifying of the write operation cycle is completed.

Reference symbol $D_{IN}$ denotes a write data, as shown at the center right of FIG. 2. The level change of $D_{IN}$ is shown in row (e) of FIG. 4. In row (e), reference symbol $t_{DH}$ denotes the term for holding the input write data $D_{IN}$. The term $t_{DHR}$ is equal to the sum of $t_{RCDmax}$ and $t_{DH}$. The term $t_{AR}$ is equal to the sum of $t_{RCDMAX}$ and $t_{CAH}$.

In the above-mentioned semiconductor memory device, which is fabricated as a metal-oxide semiconductor (MOS) memory and operated under the aforesaid address multiplex access method, the trailing edge of the $\overline{RAS}$ signal and the trailing edge of the $\overline{CAS}$ signal must be shifted in time with each other so as to avoid row and column address fetch operation error. That is, first, the term $t_{RAH}$ is given for sufficiently holding row address ($A_0 \sim A_4$). After the $t_{RAH}$ has elasped, the row address ($A_0 \sim A_4$) is switched in an address bus AB (see bottom left in FIG. 2) to the column address ($A_5 \sim A_9$). If switching term from the row address to the column address is represented by symbol $\delta$ (see row (c) in FIG. 4), the trailing edge of the $\overline{CAS}$ signal must occur later than the trailing edge of the $\overline{RAS}$ signal, and the equation of $t_{RCDmin} = t_{RAH} + \delta$ must also stand.

Figure 5:
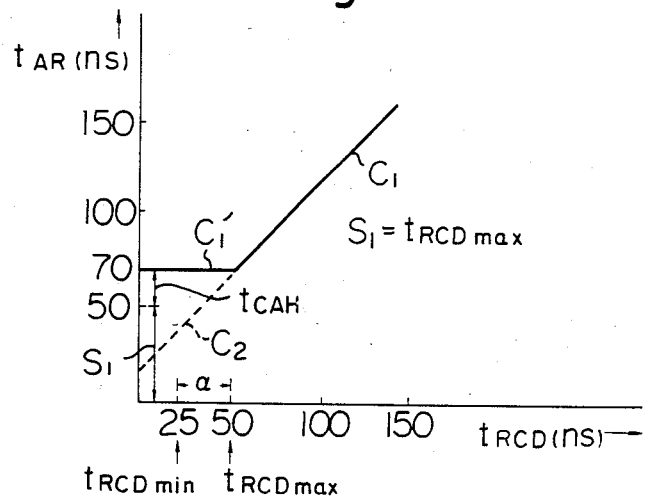
FIG. 5 is a graph representing the relationship between the terms $t_{AR}$ and $t_{RCD}$, both shown in FIG. 4.

FIG. 5 is a graph representing the relationship between the terms $t_{AR}$ and $t_{RCD}$, both shown in FIG. 4. The relationship between $t_{AR}$ and $t_{RCD}$ in the prior art semiconductor memory device is schematically represented by the characteristic curve shown by the solid lines $C_1$ and $C_1'$. It should be understood that each value of time is recited merely as an example. As seen from the graph, the term $t_{AR}$ is proportional to the term $t_{RCD}$ when the term $t_{RCD}$ is relatively long (refer to line $C_1$). However, when the term $t_{RCD}$ is shorter than a predetermined value of $t_{RCDmin}$ (about 50 ns), the value of $t_{AR}$ is maintained at a fixed value (70 ns) defined by the predetermined value (50 ns) of $t_{RCDmin}$ and, thus, the value of $t_{AR}$ can no longer be shorter than the fixed value (refer to line $C_1$).

The reason for this is as follows. With reference to FIGS. 1, 2, and 4 again, the CAS part clock generator 14 is not driven until an AND logic between $S_1$ and $\overline{CAS}$ is satisfied, in which the signal $S_1$ is the aforesaid column address enable signal produced from the RAS part clock generator 10. In other words, the CAS part clock generator 14 starts operating when both the signal $S_1$ and $\overline{CAS}$ are applied thereto. The column address enable signal $S_1$ is, in FIG. 5, generated at about 50 ns, which is defined as the term $t_{RCDmax}$. The term $t_{RCDmax}$ is the maximum value of the time delay from the change of $\overline{RAS}$ to the change of $\overline{CAS}$ and, at the same time, is the value sufficient for maintaining the minimum value of the term $t_{AR}$, i.e., $t_{ARmin}$. To be more specific, if the column address enable signal $S_1$ is applied before the end of the term $t_{RCDmin}$ to the CAS part clock generator 14, the generator 14 can start operating at the same time as the arrival of the $\overline{CAS}$ signal.

Soon after this, the column address buffer 16 starts operating by receiving an output clock (refer to S″ in FIG. 1) produced from the generator 14, now operating. Accordingly, the term $t_{CAH}$ (see row (c) in FIG. 4) can be quickly started. However, if the column address enable signal $S_1$ is applied after the term $t_{RCDmin}$ to the CAS part clock generator 14, the generator 14 cannot start operating until the $\overline{CAS}$ signal is supplied. Therefore, the column address buffer 16 waits for the arrival of the signal $S_1$ and starts operating thereafter. Thus, the value of the term $t_{ARmin}$ is larger than the sum of the values of the terms $t_{RCDmin}$ and $t_{CAH}$.

As mentioned above, in the prior art semiconductor memory device, the term $t_{AR}$ in row (c) of FIG. 4 becomes relatively long.

Figure 6:
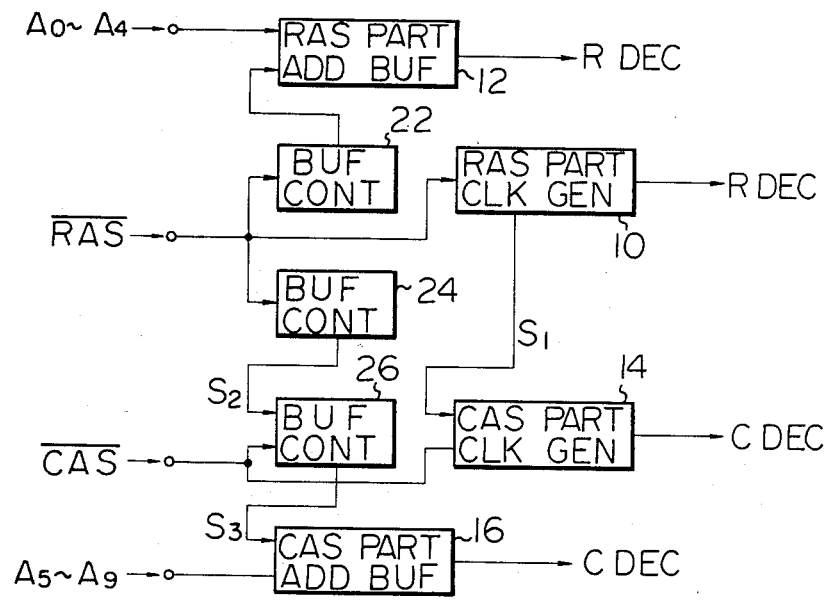
FIG. 6 is a block diagram of a semiconductor memory device according to an embodiment of the present invention.

FIG. 6 is a block diagram of a semiconductor memory device according to an embodiment of the present invention. In FIG. 6, members the same as those of FIGS. 1 and 2 are represented by the same reference numerals or symbols.

The essential feature of the present invention resides in the fact that a certain means is newly employed, that is, a means for detecting and holding the row address strobe signal $\overline{RAS}$ so as to quickly produce a timing control signal (corresponding to S" in FIG. 1) to be supplied to the column address buffer 16. The above-mentioned means is constructed by, for example, a first buffer control circuit 24, a second buffer control circuit 26, and a third buffer control circuit 22. The third buffer control circuit 22 cooperates with the row address buffer 12. The first buffer control circuit 24 receives the $\overline{RAS}$ signal and controls the second buffer control circuit 26. The second buffer control circuit 26 controls the column address buffer 16. The first buffer control circuit 24 directly receives the $\overline{RAS}$ signal and produces column address enable signals $S_2$ and $S_3$ to be applied to the second buffer control circuit 26 and the column address buffer 16. Among these buffer control circuits, the second and third buffer control circuits 22 and 26 are not newly employed hardware, but can be common to the prior art hardware.

Figure 7:
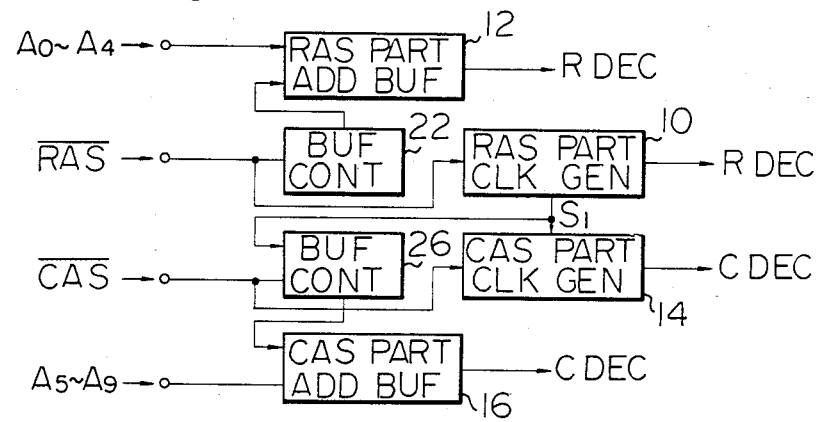
FIG. 7 is a more detailed block diagram of the arrangement of FIG. 1.

FIG. 7 is a more detailed block diagram of the arrangement of FIG. 1. The arrangement of FIG. 7 (FIG. 1) is used in a prior art semiconductor memory device. Although the second and third buffer control circuits 26 and 22 are not illustrated in FIG. 1 for simplification of the explanation regarding prior art, FIG. 7 shows the second and third buffer control circuit 22 and 26 commonly exist in the prior art device. As clearly seen, the device of the present invention produces a considerably useful advantage while requiring minimal change in design with respect to the prior art. The series connection of the first and second buffer control circuits 24 and 26 is a significant feature of the present invention.

Figure 8:
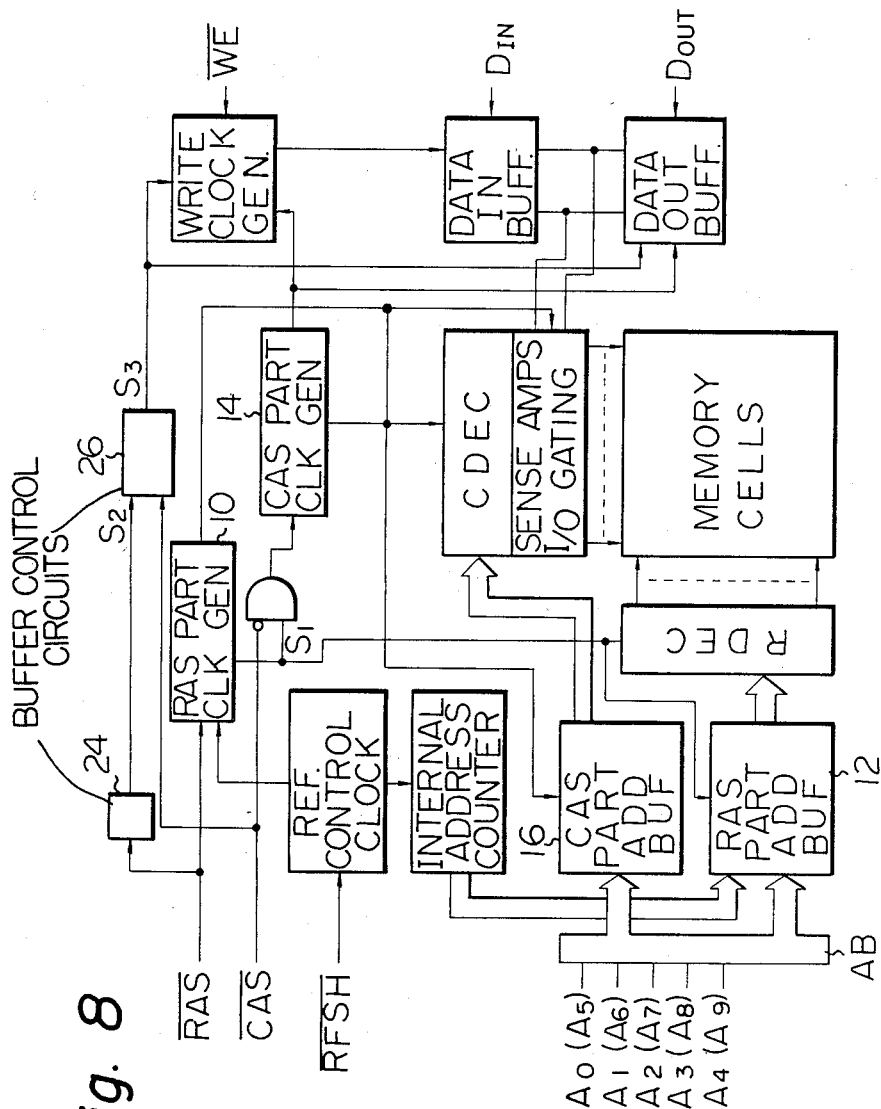
FIG. 8 is a block diagram of one example of a semiconductor memory device shown in FIG. 2 further provided with circuits 24 and 26 of FIG. 6, those circuits characterizing the present invention.

FIG. 8 is a block diagram of one example of the semiconductor memory device shown in FIG. 2 further provided with circuits 24 and 26 of FIG. 6, which are included in the present invention.

The operation of the circuit shown in FIG. 6 is as follows. With reference to FIG. 6 and also FIG. 4, first the column address enable signal $S_1$ is produced from the RAS part clock generator 10 and applied to the CAS part clock generator 14. The CAS part clock generator operation starts after activation of the RAS part clock generator operation. These operations are the same as those performed in the aforementioned prior art semiconductor memory device. However, in the present invention, it is important to note that the timing control signals $S_2$ and $S_3$ of FIG. 6 are generated faster than the corresponding signals $S_1$ and S" of FIG. 1 in the prior art device. This is because the signals $S_2$ and $S_3$ are not derived from the column address enable signal $S_1$, but from the $\overline{RAS}$ signal itself, which occurs faster than the signal $S_1$. In other words, the signal activating the buffer 16 of FIG. 1 is generated via the generator 14, while the signal activating the buffer 16 of FIG. 6 is not generated via such a generator 14. Consequently, the buffer 16 of FIG. 6 can be set in the enable state faster than the buffer 16 of FIG. 1.

According to the above operations of the present invention, when the level of the $\overline{CAS}$ signal changes to L, various operations, such as the column address fetch, the write command fetch, and input write data fetch operations, can be started immediately after a predetermined column address holding term. In other words, the CAS part clock generator operation can always be activated by the $\overline{CAS}$ signal, therefore, the equation $t_{AR}=t_{RCD}+t_{CAH}$ always stands. This results in the solid line $C_1$ in FIG. 5 not being horizontal in the range where $t_{RCD}$ is 0 through 50 ns, but transformed to the line indicated by the broken, which line $C_2$ is an extension of the inclined solid line $C_1$.

Taking experimental values as an example, in the present invention, when $t_{RAH}=15$ ns and $\delta=10$ ns, $t_{RCD}$ can be reduced to 25 ns. However, in the prior art memory device, the minimum value of $t_{RCD}$ is fixed at 50 ns. To be specific, with reference to FIG. 7, according to the prior art arrangement, the signal $S_1$ from the RAS part clock generator 10 is applied to the buffer control circuit 26 and, thereafter, the column address buffer 16 can be brought in an enable state by an output signal from the buffer control circuit 26. Accordingly, it is required to set the term $t_{RCD}$ (see FIG. 4) as long as possible. This results in the term $t_{AR}$ becoming unnecessarily long. However, according to the present invention, as seen from FIG. 6, the timing control signal $S_2$ is directly derived from the buffer control circuit 26 when it receives the $\overline{RAS}$ signal, In this case, the signal $S_2$ is generated 5 to 10 ns after the reception of the $\overline{RAS}$ signal. Therefore, the buffer control circuit 26 and the column address buffer 16 can be set in the enable state even during the term $t_{RAH}$ (see FIG. 4). In the prior art, the circuit 26 and the buffer 16 cannot be set in the enable state until the term $t_{RAH}$ passes. Consequently, the CAS part can be active immediately after the buffer control circuit 26 receives the timing control signal $S_2$ from the RAS part buffer control circuit 24 and the address buffer 16 receives the timing control signal $S_3$ from the circuit 26. In this way the term $t_{AR}$ can be shortened. Further, since the CAS part clock generator operation is controlled by the $\overline{CAS}$ signal, the equation $t_{AR}=t_{RCD}+t_{CAH}$ always stands and there is no need to indicate minimum values of the term $t_{AR}$ in catalogs and the like. Therefore, the user is not restricted by the condition of $t_{AR}$ during use of the memory device.

The generation of the timing control signal $S_2$ should be before the occurrence of the trailing edge of the $\overline{CAS}$ signal. In this case, since the occurrence of the trailing edge of the $\overline{CAS}$ signal can be variable in the range between the minimum and maximum values of the term $t_{RCD}$, the generation of the signal $S_2$ should be before the minimum value of $t_{RCD}$. The minimum value of $t_{RCD}$ is, in the prior art, 50 ns, as shown in FIG. 5. That is, when $t_{CAH}$ is set to be 20 ns, the equation $t_{AR}-t_{CAH}=70-20=50$ stands.

Figure 9:
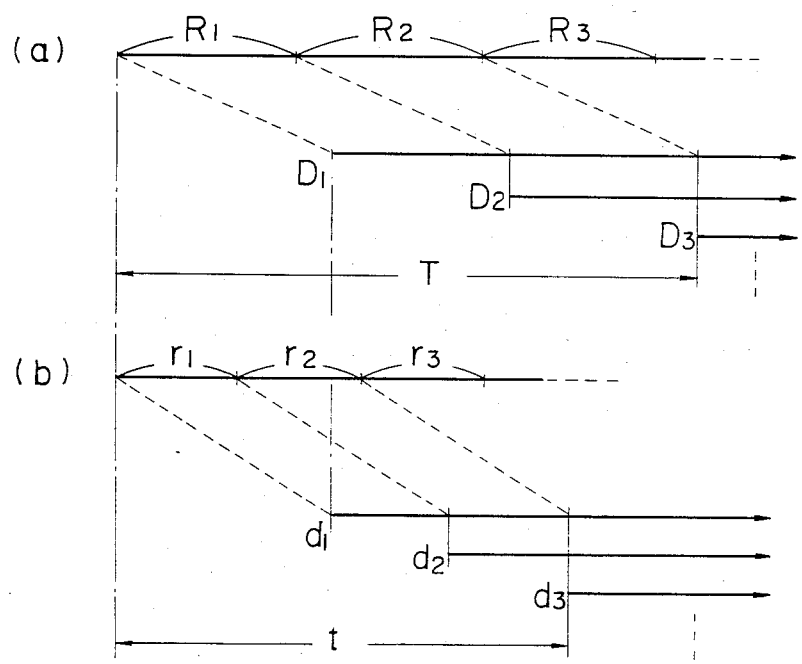
FIGS. 9(a) and 9(b) are timing charts used for explaining the advantage of the present invention.

The essential advantage of the present invention is that the cycle time of a memory is shortened, because the address hold time is minimized. This advantage is remarkable when the semiconductor memory devices of the present invention are operated under a so-called interleave mode. This will be clarified with reference to FIG. 9. FIG. 9 depicts timing charts used for schematically explaining the advantage of the present invention. In FIG. 9(a), reference symbols R1, R2, R3—represent read cycles performed in memory blocks MB1, MB2, MB3—, respectively (not shown). Reference symbols D1, D2, D3—represent read data from the memory blocks, respectively. FIG. 9(a) corresponds to a prior art circuit. In FIG. 9(b), reference symbols r1, r2, r3—represent read cycles performed in memory blocks MB1, MB2, MB3—, respectively (not shown). Reference symbols d1, d2, d3—represent read data from the memory blocks, respectively. FIG. 9(b) corresponds to the present invention. As is apparent from FIG. 9, although the read access time similar to write access time itself is the same in both FIG. 9(a) and FIG. 9(b), the time required for a series of data, for example D1, D2, D3 (d1, d2, d3), is different. The required time is indicated as T in FIG. 9(a) and t in FIG. 9(b), where t obtained in the present invention is clearly shorter than T obtained in the prior art device.

Figure 10:
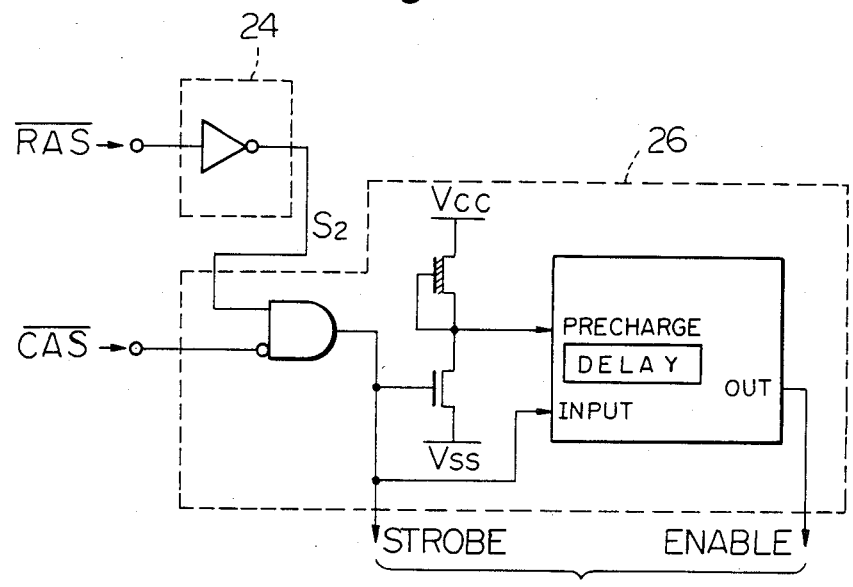
FIG. 10 is a circuit diagram of one example of the blocks 24 and 26 shown in FIG. 6.
Figure 11:
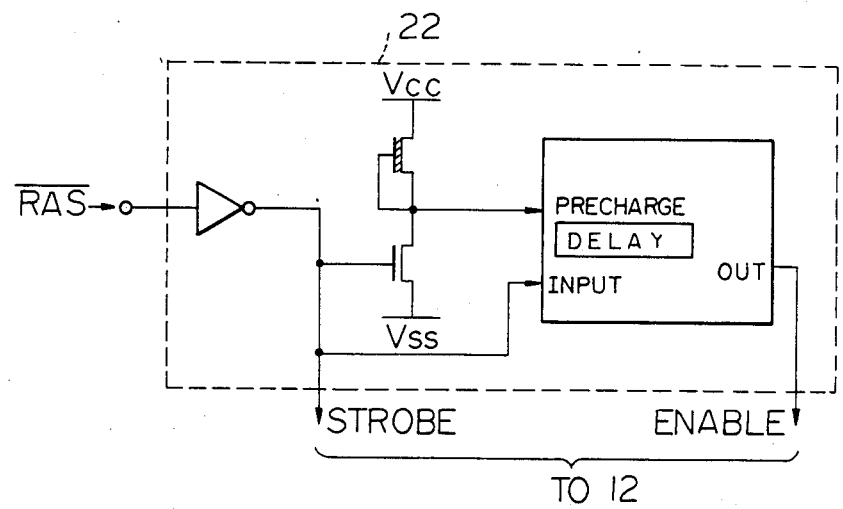
FIG. 11 is a circuit diagram of one example of the block 22 shown in FIG. 6.
Figure 12:
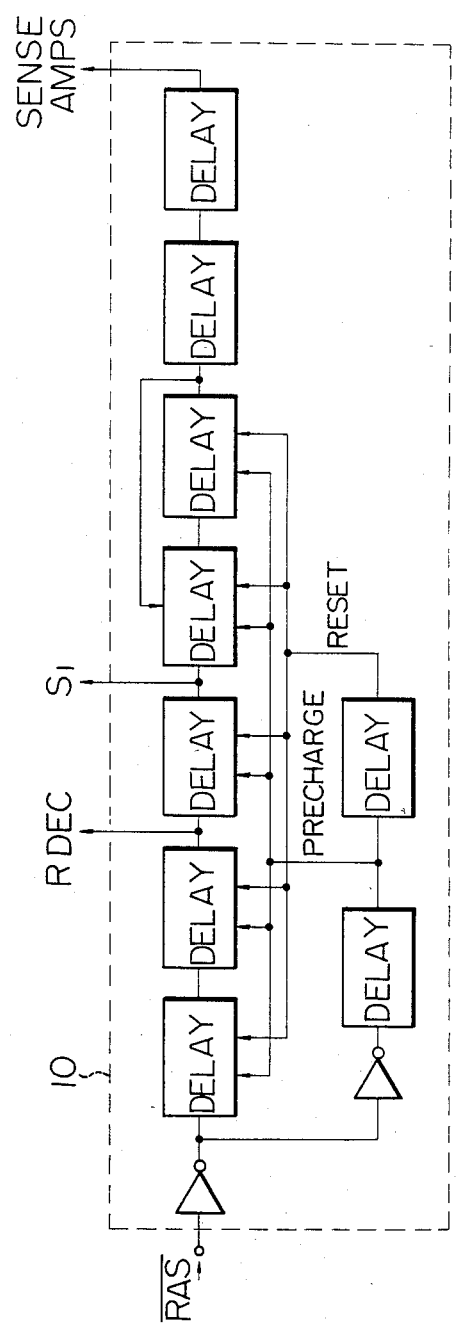
FIG. 12 is a circuit diagram of one example of the block 10 shown in FIG. 6.
Figure 13:
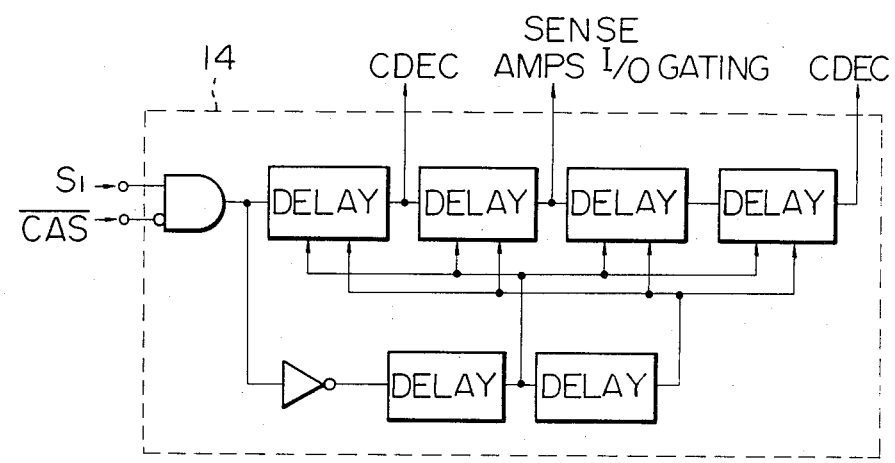
FIG. 13 is a circuit diagram of one example of the block 14 shown in FIG. 6.
Figure 14:
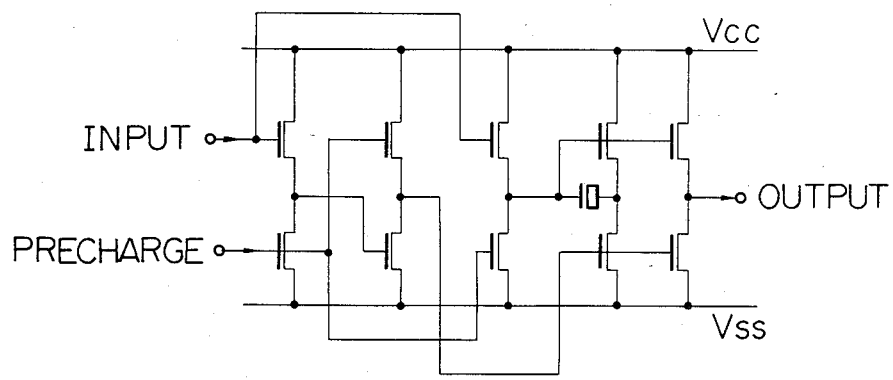
FIG. 14 is a circuit diagram of one example of each delay circuit shown in FIGS. 10, 11, 12, and 13.
Figure 15:
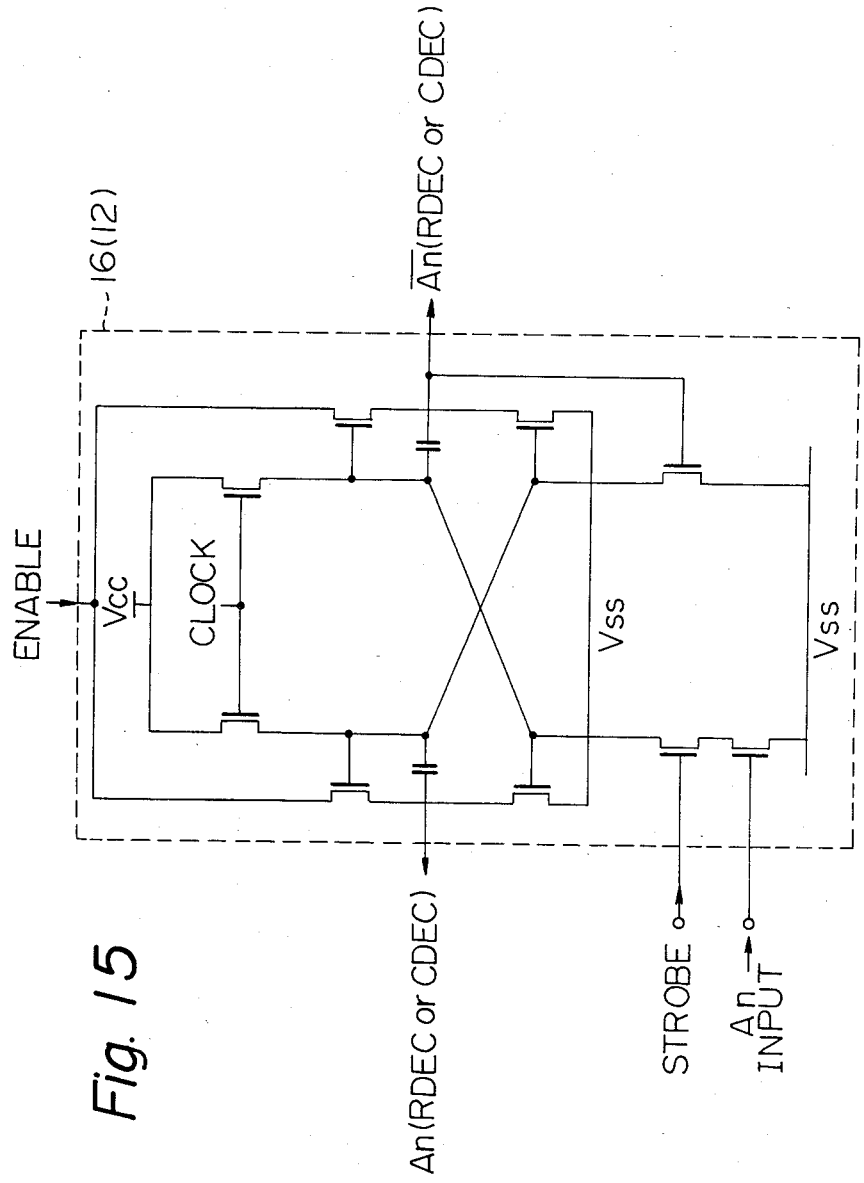
FIG. 15 is a circuit diagram of one example of the block 16 shown in FIG. 6.

Finally, a detailed example of each block shown in FIG. 6 will be disclosed. FIG. 10 is a circuit diagram of an example of the blocks 24 and 26 shown in FIG. 6. The buffer control circuit 24 is an inverter acting as a level converter. FIG. 11 is a circuit diagram of an example of the block 22 shown in FIG. 6. FIG. 12 is a circuit diagram of an example of the block 10 shown in FIG. 6. FIG. 13 is a circuit diagram of an example of the block 14 shown in FIG. 6. FIG. 14 is a circuit diagram of an example of each delay circuit shown in FIGS. 10, 11, 12, and 13. FIG. 15 is a circuit diagram of an example of the block 16 shown in FIG. 6. The circuit construction of FIG. 15 is identical to the row address buffer 12 shown in FIG. 8.

We claim:

1. A semiconductor memory device having memory cells, a row part having a row address signal and a column part having a column address signal, the semiconductor memory device operatively connected to receive a row address strobe signal and a column address strobe signal, comprising:
   a row address buffer operatively connected to receive the row address signal when the row address strobe signal is externally supplied to the semiconductor memory device;
   a column address buffer operatively connected to receive the column address signal when the column address strobe signal is externally supplied to the semiconductor memory device;
   a row decoder and a column decoder, operatively connected to said row and column address buffers, respectively, for selecting one of the memory cells specified by the row and column address signals;
   a row address strobe part clock generator, operatively connected to receive the row address strobe signal, for producing a first timing control signal for enabling the row part; and
   a column address strobe part clock generator, operatively connected to said row address strobe part clock generator, for simultaneously receiving the column address strobe signal and the first timing control signal and for producing an actual timing control signal for enabling the column part; and
   circuit means, operatively connected to receive said row address strobe signal and said column address strobe signal and operatively connected to said column address buffer, for detecting and holding the row address strobe signal and producing a second timing control signal, input to said column address buffer, for enabling said column address buffer upon receipt of both said column address strobe signal and said row address strobe signal.

2. A semiconductor memory device as set forth in claim 1, wherein said circuit for detecting and holding the row address strobe signal comprises at least first and second buffer control circuits, said first buffer control circuit directly connected to said second buffer control circuit and said row address buffer, for receiving the row address strobe signal and producing a third timing control signal to be supplied to said second buffer control circuit, said second buffer control circuit, operatively connected to said column address buffer, for producing the second timing control signal which enables said column address buffer when the second buffer control circuit simultaneously receives both the third timing control signal and the column address strobe signal.

3. A semiconductor memory device as set forth in claim 2, wherein said second buffer control circuit includes an AND logic gate, operatively connected to said first buffer control circuit and said column address buffer, for receiving the column address strobe signal and the third timing control signal from said first buffer control circuit.

4. A semiconductor memory device as set forth in claim 3, wherein said first buffer control circuit is an inverter which functions as a level converter.

5. A semiconductor memory device as set forth in claim 1, wherein the memory cells are arranged in a plurality of memory blocks each of the memory blocks being operated in an interleave mode.

6. A semiconductor memory device, operatively connected to receive address signals and row and column address strobe signals, comprising:
   a first buffer control circuit, operatively connected to receive the row address strobe signals, for producing address enable signals;
   a second buffer control circuit, operatively connected in series with said first buffer control circuit and operatively connected to receive the column address strobe signals and the address enable signals;
   a column address buffer, operatively connected in series with said second buffer control circuit, for receiving the address signals;
   a third buffer control circuit operatively connected to receive the row address strobe signals;
   a row address buffer, operatively connected to said third buffer circuit and operatively connected to receive the address signals;
   a row address strobe part clock generator, operatively connected to receive the row address strobe signals, for providing a clock signal; and
   a column address strobe part clock generator, operatively connected to said second buffer control circuit and said row address strobe part clock generator, for receiving the clock signal.

* * * * *

UNITED STATES PATENT AND TRADEMARK OFFICE
CERTIFICATE OF CORRECTION

PATENT NO. : 4,602,356

DATED : JULY 22, 1986

INVENTOR(S) : SHIGEKI NOZAKI ET AL.

It is certified that error appears in the above-identified patent and that said Letters Patent is hereby corrected as shown below:

Col. 1, line 21, "sequential." should be --sequentially.--;
line 22, "tially" should be --tial--.

Col. 2, line 52, "CAS" should be --$\overline{CAS}$--;
line 58, "i,e.," should be --i.e.,--.

Col. 3, line 60, delete "specifying of the";
line 67, "$t_{RCDMAX}$" should be --$t_{RCDmax}$--.

Col. 4, line 9, after "holding" insert --the--;
line 10, delete "the" (first occurrence);
line 13, after "If" insert --the--;
line 17, "tRAH" should be --$t_{RAH}$--.

Col. 6, line 2, "$t_{CAH}$always" should be --$t_{CAH}$ always--;

line 5, "broken, which line $C_2$" should be

--broken line $C_2$, which--.

Signed and Sealed this

Eleventh Day of November, 1986

*Attest:*

DONALD J. QUIGG

*Attesting Officer*      *Commissioner of Patents and Trademarks*